(12) United States Patent
Akai et al.

(10) Patent No.: US 12,354,851 B2
(45) Date of Patent: Jul. 8, 2025

(54) WAFER PLACEMENT TABLE

(71) Applicant: NGK INSULATORS, LTD., Nagoya (JP)

(72) Inventors: Yusuke Akai, Handa (JP); Junpei Naka, Santa Clara, CA (US)

(73) Assignee: NGK INSULATORS, LTD., Nagoya (JP)

(*) Notice: Subject to any disclaimer, the term of this patent is extended or adjusted under 35 U.S.C. 154(b) by 168 days.

(21) Appl. No.: 18/366,085

(22) Filed: Aug. 7, 2023

(65) Prior Publication Data

US 2024/0274413 A1 Aug. 15, 2024

Related U.S. Application Data

(63) Continuation of application No. PCT/JP2023/004362, filed on Feb. 9, 2023.

(51) Int. Cl.
*H01T 23/00* (2006.01)
*H01J 37/32* (2006.01)

(52) U.S. Cl.
CPC . *H01J 37/32715* (2013.01); *H01J 2237/2007* (2013.01)

(58) Field of Classification Search
None
See application file for complete search history.

(56) References Cited

U.S. PATENT DOCUMENTS

| 10,741,425 | B2 | 8/2020 | Hao et al. |
| 2013/0279066 | A1 | 10/2013 | Lubomirsky et al. |
| 2019/0019654 | A1 | 1/2019 | Kobayashi |
| 2020/0135529 | A1 | 4/2020 | Shiraishi et al. |
| 2020/0227291 | A1 | 7/2020 | Ishikawa et al. |
| 2020/0286769 | A1* | 9/2020 | Shiraishi ........... H01L 21/68714 |
| 2023/0238224 | A1* | 7/2023 | Inoue ................. H01L 21/6831 279/128 |

FOREIGN PATENT DOCUMENTS

| JP | 2015-517225 A | 6/2015 |
| JP | 2019-021708 A | 2/2019 |
| JP | 2020-072262 A | 5/2020 |
| JP | 7149914 B2 | 10/2022 |
| KR | 10-2327461 B1 | 11/2021 |

OTHER PUBLICATIONS

International Search Report and Written Opinion (Application No. PCT/JP2023/004362) dated Apr. 18, 2023 (7 pages).

* cited by examiner

*Primary Examiner* — Stephen W Jackson
(74) *Attorney, Agent, or Firm* — BURR PATENT LAW, PLLC (57) ABSTRACT

A wafer placement table includes: a ceramic plate having a pore extending vertically through the ceramic plate, a conductive plate bonded to a lower surface of the ceramic plate and having a gas supply passage; a plug chamber that is in communication with the pore and the gas supply passage; an insulating gas passage plug located in the plug chamber and a dense insulating film. The dense insulating film allows ventilation at a gas outlet portion that is a portion of an upper surface of the insulating gas passage plug and serves as a gas flow path to the pore, and the dense insulating film is disposed across the upper surface of the conductive plate and the upper surface of the insulating gas passage plug to cover a boundary between the upper surface of the conductive plate and the upper surface of the insulating gas passage plug.

7 Claims, 5 Drawing Sheets

WAFER PLACEMENT TABLE

BACKGROUND OF THE INVENTION

1. Field of the Invention

The present invention relates to a wafer placement table.

2. Description of the Related Art

A conventionally known wafer placement table includes a ceramic plate that has an upper surface serving as a wafer placement surface and a base plate that is bonded to a lower surface of the ceramic plate and has a gas inlet path. In PTL 1, the wafer placement table has a first porous portion having insulating properties that is in a through hole in the ceramic plate and a second porous portion having insulating properties that is in a recess on a surface of the base plate adjacent to the ceramic plate and is opposed to the first porous portion. Gas fed to the gas inlet path flows through the second and first porous portions to a space between the wafer placement surface and the wafer to cool a target object. The second porous portion has a porous ceramic body and a ceramic insulating film formed on a side surface of the porous ceramic body by thermal spraying. The ceramic insulating film is in contact with the inner peripheral surface of the recess in the base plate. PTL 1 describes that the presence of the second porous portion provides high insulating properties.

CITATION LIST

Patent Literature

PTL 1: JP 2020-72262 A

SUMMARY OF THE INVENTION

However, although the second porous portion having insulating properties is present as in PTL 1, electrical discharges may occur in the second porous portion along the path between the side surface of the ceramic porous body and the ceramic insulating film.

The present invention was made to solve the above-described problem, and the main object is to reduce electrical discharges near a side surface of an insulating gas passage plug.

The present invention has adopted the following measures to achieve the above-described main object.

[1] A wafer placement table according to the present invention includes: a ceramic plate having an upper surface serving as a wafer placement surface, a pore extending vertically through the ceramic plate, and a built-in electrode; a conductive plate bonded to a lower surface of the ceramic plate and having a gas supply passage; a plug chamber that is a recess extending from an upper surface of the conductive plate toward a lower surface of the conductive plate and is in communication with the pore and the gas supply passage; an insulating gas passage plug located in the plug chamber and through which gas is allowed to pass; and a dense insulating film allowing ventilation at a gas outlet portion that is a portion of an upper surface of the insulating gas passage plug and serves as a gas flow path to the pore, the dense insulating film being disposed across the upper surface of the conductive plate and the upper surface of the insulating gas passage plug to cover a boundary between the upper surface of the conductive plate and the upper surface of the insulating gas passage plug.

In this wafer placement table, the dense insulating film is disposed across the upper surface of the conductive plate and the upper surface of the insulating gas passage plug to cover a boundary between the upper surface of the conductive plate and the upper surface of the insulating gas passage plug. The presence of such a dense insulating film can reduce the occurrence of electrical discharges in the vertical path extending from the boundary between the upper surface of the conductive plate and the upper surface of the insulating gas passage plug along the side surface of the insulating gas passage plug. Furthermore, the dense insulating film allows ventilation at the gas outlet portion of the insulating gas passage plug, and thus gas can flow from the gas supply passage to the pore through the insulating gas passage plug.

[2] In the above-described wafer placement table (the wafer placement table described in [1]), the upper surface of the insulating gas passage plug may have a protrusion having an upper surface serving as the gas outlet portion, and an upper surface of the dense insulating film and an upper surface of the protrusion may be flush with each other.

[3] In the above-described wafer placement table (the wafer placement table described in [1] or [2] above), the dense insulating film may be a thermal sprayed film or an aerosol deposition film. With this configuration, a dense insulating film can be relatively readily formed.

[4] The above-described wafer placement table (the wafer placement table described in any one of [1] and [3] above) may further include an elastic member between a lower surface of the insulating gas passage plug and a bottom surface of the plug chamber. With this configuration, the presence of the elastic member can reduce the possibility that the insulating gas passage plug will be pushed up when the conductive plate is heated and warped into a convex shape, for example, during use of the wafer placement table. This can reduce cracks in the dense insulating film. In this case, a gap may be provided between the lower surface of the insulating gas passage plug and the bottom surface of the plug chamber by the elastic member.

[5] In the above-described wafer placement table (the wafer placement table described in [4] above), the elastic member may be a heat-resistant resin. With this configuration, the elastic member can be relatively readily formed.

[6] In the above-described wafer placement table (the wafer placement table described in any one of [1] to [5] above), the insulating gas passage plug may be a porous member.

DETAILED DESCRIPTION OF THE INVENTION

Figure 1:
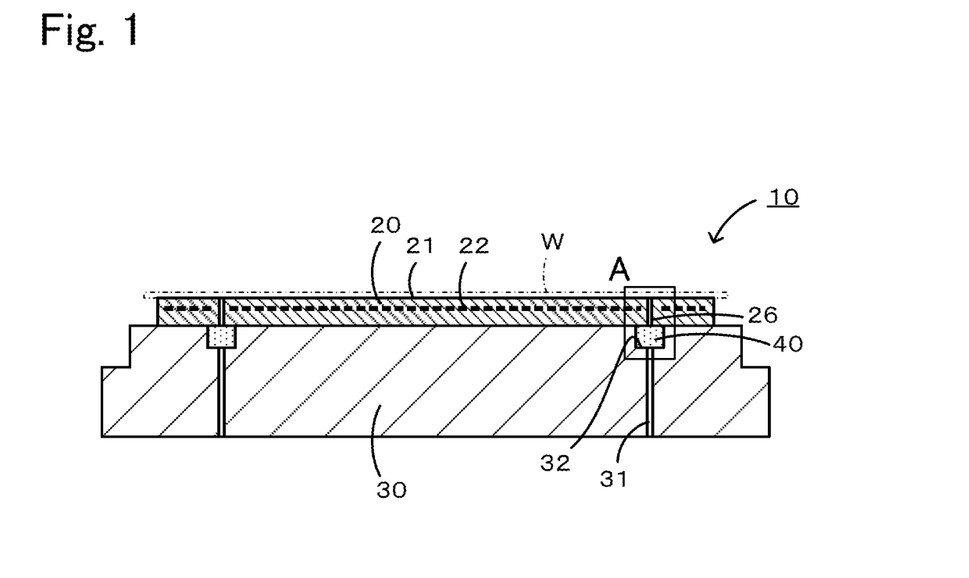
FIG. 1 is a vertical cross-sectional view of a wafer placement table 10.
Figure 2:
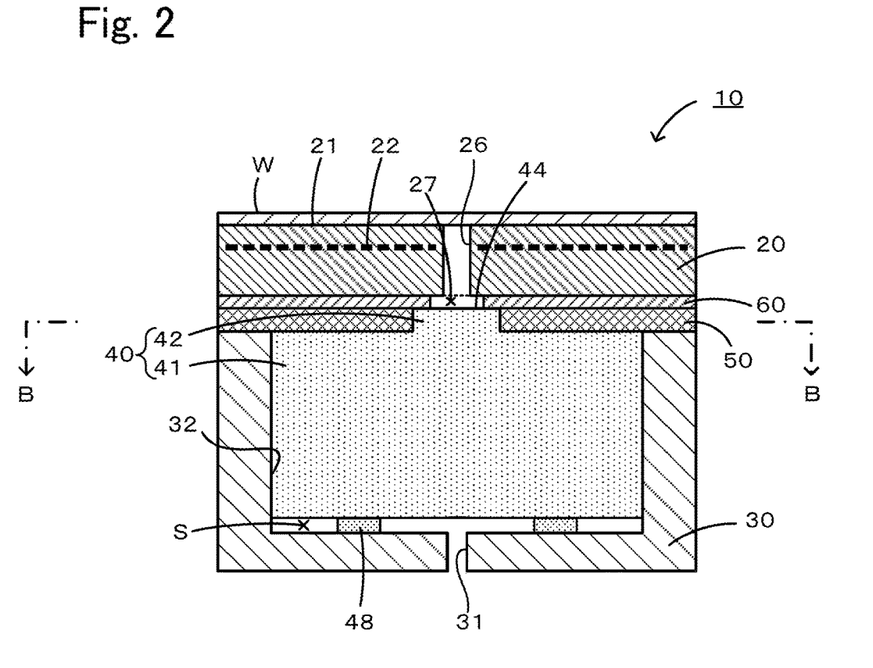
FIG. 2 is a partial magnified view of Portion A in FIG. 1.
Figure 3:
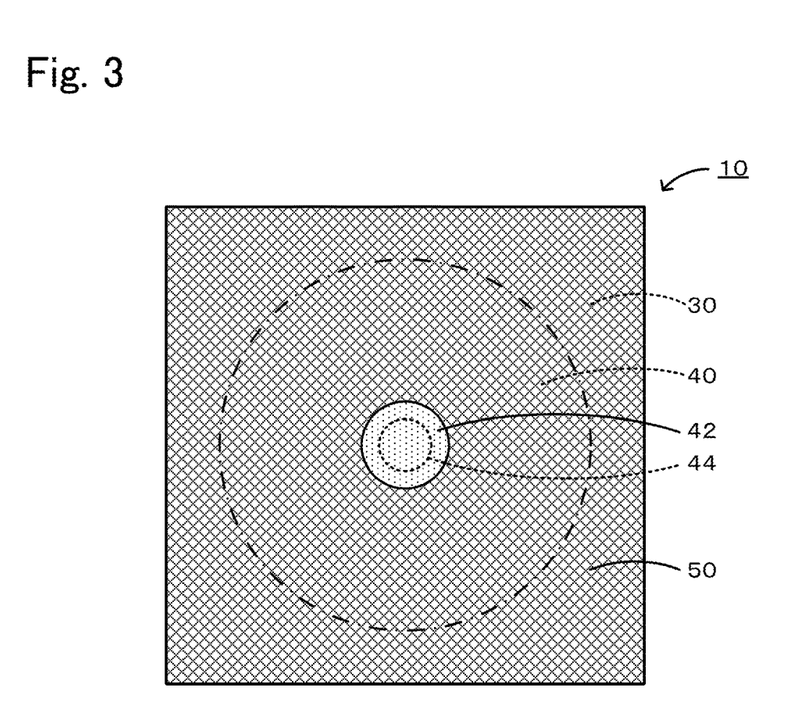
FIG. 3 is a cross-sectional view taken along B-B in FIG. 2.

A preferable embodiment of the present invention will be described with reference to the drawings. FIG. 1 is a vertical cross-sectional view of the wafer placement table 10, FIG. 2 is a magnified view of Portion A in FIG. 1, and FIG. 3 is a cross-sectional view taken along B-B in FIG. 2 (front view (overall view) of the wafer placement table 10 cut along cutting-plane line B-B in FIG. 2). In this specification, "up" and "down" do not represent an absolute positional relationship but represent a relative positional relationship. Thus, "up" and "down" can change to "down" and "up", "left" and "right", or "front" and "rear" depending on the orientation of the wafer placement table 10.

As illustrated in FIG. 1, the wafer placement table 10 includes a ceramic plate 20, a conductive plate 30, and an insulating gas passage plug 40. Furthermore, as illustrated in FIG. 2, the wafer placement table 10 includes a dense insulating film 50 and a bonding sheet 60.

The ceramic plate 20 is a disc (for example, having a diameter of 300 mm and a thickness of 5 mm) formed of ceramic, such as an alumina sintered body and an aluminum nitride sintered body. The upper surface of the ceramic plate 20 is a wafer placement surface 21 on which a wafer W is placed. The ceramic plate 20 has a built-in electrode 22. The electrode 22 is a flat mesh electrode used as an electrostatic electrode and is connected to an external DC power supply through a power feeder (not illustrated). A low-pass filter may be placed along the power feeder. The power feeder is electrically insulated from the conductive plate 30. When a DC voltage is applied across the electrode 22, the wafer W is attracted and fixed to the wafer placement surface 21 by the electrostatic attraction. When the application of a DC voltage is stopped, the wafer W is not attracted and fixed to the wafer placement surface 21. The ceramic plate 20 has pores 26. The pore 26 extends vertically through the ceramic plate 20 and serves as a gas passage extending from the lower surface of the ceramic plate 20 to the wafer placement surface 21. The ceramic plate 20 has multiple pores 26.

The conductive plate 30 is a disc having high thermal conductivity (a disc having a diameter equal to or larger than that of the ceramic plate 20). The conductive plate 30 has a gas supply passage 31 and a plug chamber 32. The plug chamber 32 is open on the upper surface of the conductive plate 30 (the surface adjacent to the ceramic plate 20) and is a recess extending from the upper surface toward the lower surface. The plug chamber 32 has a cylindrical inner space, for example. The gas supply passage 31 is a gas passage extending from the plug chamber 32 to the lower surface of the conductive plate 30. In this embodiment, the gas supply passage 31 is a through hole extending vertically through the conductive plate 30 from the bottom surface of the plug chamber 32 to the lower surface of the conductive plate 30. The conductive plate 30 has an internal refrigerant flow path (not illustrated). The refrigerant flowing through the refrigerant flow path is preferably liquid and preferably has electrical insulating properties. Examples of the electrically insulating liquid include a fluorinated inert liquid. The refrigerant flow path extends in a one-stroke pattern over the entire conductive plate 30 from one end (inlet) to the other end (outlet) in plan view. A supply port and a recovery port of an external refrigerant apparatus (not illustrated) are connected to the one end and the other end of the refrigerant flow path, respectively. The conductive plate 30 is connected to a radio frequency (RF) power supply and is also used as an RF electrode.

The material of the conductive plate 30 may be, for example, a metal material or a metal-ceramic composite material. Examples of the metal material include Al, Ti, Mo, and alloys of them. Examples of the metal-ceramic composite material include metal matrix composites (MMC) and ceramic matrix composites (CMC). Specific examples of the composite materials include a material containing Si, SiC, and Ti (may be referred to as SiSiCTi) and a material containing a porous SiC body impregnated with Al and/or Si, and an $Al_2O_3$—TiC composite material. The material of the conductive plate 30 is preferably a material having a coefficient of thermal expansion close to that of the material of the ceramic plate 20.

The insulating gas passage plug 40 is an insulating member through which gas can pass and located in the plug chamber 32. The insulating gas passage plug 40 is a porous member in this embodiment. The insulating gas passage plug 40 is in communication with the gas supply passage 31 and the pore 26, and thus gas in the gas supply passage 31 can flow to the wafer placement surface 21. The insulating gas passage plugs 40 in the conductive plate 30 are equal in number to the pores 26, the gas supply passages 31, and the plug chambers 32, and they correspond one-to-one to each other. The insulating gas passage plug 40 includes a cylindrical body 41 and a cylindrical protrusion 42 located at the center of the upper surface of the body 41 and having a smaller diameter than the body 41. The upper surface of the protrusion 42 is located directly below the pore 26 and serves as an outlet through which gas from the insulating gas passage plug 40 flows out to the pore 26. More specifically, a portion of the upper surface of the protrusion 42 that is not in contact with the bonding sheet 60 (the circular area indicated by the dotted line in FIG. 3) is the gas outlet portion 44. The side surface (outer peripheral surface) of the body 41 of the insulating gas passage plug 40 may be bonded to the inner peripheral surface of the plug chamber 32, or male threads on the side surface of the insulating gas passage plug 40 may be engaged with female threads on the inner peripheral surface of the plug chamber 32. The upper surface of the insulating gas passage plug 40, excluding the protrusion 42, is flush with the upper surface of the conductive plate 30.

The insulating gas passage plug 40 may be a porous bulk produced through sintering of ceramic powder. The ceramic may be, for example, alumina or aluminum nitride. The insulating gas passage plug 40 has a porosity of, preferably, greater than or equal to 30% and has an average pore diameter of, preferably, greater than or equal to 15 μm. The porosity of the insulating gas passage plug 40 may be less than or equal to 70%.

An elastic member 48 is disposed between the lower surface of the insulating gas passage plug 40 and the bottom surface of the plug chamber 32 of the conductive plate 30. In this embodiment, the elastic member 48 has a ring shape centered at the position of the opening of the gas supply passage 31 in top view. The elastic member 48 is in contact only with a portion of the lower surface of the insulating gas passage plug 40 and a portion of the bottom surface of the plug chamber 32 to provide a gap S between the lower surface of the insulating gas passage plug 40 and the bottom surface of the plug chamber 32 of the conductive plate 30. The height of the gap S in the vertical direction may be, for example, greater than or equal to 0.1 mm and less than or equal to 1 mm. The elastic member 48 is located away from the opening of the gas supply passage 31 on the bottom surface of the plug chamber 32 so as not to prevent flow of gas from the gas supply passage 31 to the insulating gas passage plug 40. The elastic member 48 may be formed of, for example, a heat-resistant resin. Examples of the heat-resistant resin include fluorinated resins such as Teflon (Teflon is a registered trademark), acrylic resins, and polyimide resins. These resins are preferred because they have 200° C. or higher heat resistance, which is required for the wafer placement table 10, and hardly produce gas when used under vacuum.

The dense insulating film 50 is a dense film having insulating properties and covers the upper surfaces of the conductive plate 30 and the insulating gas passage plug 40. More specifically, the dense insulating film 50 is disposed across the upper surface of the conductive plate 30 and the upper surface of the body 41 of the insulating gas passage plug 40. Thus, the dense insulating film 50 covers the boundary between the upper surface of the conductive plate 30 and the upper surface of the body 41 of the insulating gas passage plug 40 (see the dash-dot-dash line in FIG. 3). The dense insulating film 50 does not cover the upper surface of the protrusion 42 and thus does not cover the gas outlet portion 44, which is a portion of the protrusion 42. With this configuration, the dense insulating film 50 allows ventilation at the gas outlet portion 44. The thickness of the dense insulating film 50 is equal to the height of the protrusion 42, and thus the upper surface of the dense insulating film 50 and the upper surface of the protrusion 42 are flush with each other. In this specification, "flush with each other" may include "substantially flush with each other. For example, there may be inevitable manufacturing height variations, or minute irregularities on the upper surface of the dense insulating film 50 and/or the upper surface of the protrusion 42. In this embodiment, the dense insulating film 50 covers the entire upper surface of the conductive plate 30 (the surface bonded to the ceramic plate 20) and the entire upper surface of the body 41 of the insulating gas passage plug 40. The dense insulating film 50 is in contact with the side surface of the protrusion 42 and covers the entire side surface of the protrusion 42.

The dense insulating film 50 is, for example, a sprayed film or an aerosol deposition film (AD film). If the dense insulating film 50 is a sprayed film, the sprayed film may be formed of the same material as the insulating gas passage plug 40. If the insulating gas passage plug 40 is formed of alumina, the sprayed film may be formed of alumina. Alternatively, the sprayed film may be formed of the same material as the ceramic material contained in the conductive plate 30. The AD film is a film formed by AD method (including a plasma AD method). The AD method forms a film of ceramic particles using the impact solidification phenomenon and requires no sintering of ceramic particles at high temperature. When the dense insulating film 50 is an AD film, the above materials of the sprayed film can also be used.

In this specification, "dense" means gastight dense. The dense insulating film 50 may have a porosity of, for example, less than 3%, preferably less than 1%. The porosity is defined as a ratio of the pore area identified in the observed image of a representative cross-section observed using a scanning electron microscope (SEM) at 50-fold magnification.

The bonding sheet 60 is an insulating adhesive layer disposed between the lower surface of ceramic plate 20 and the upper surface of the dense insulating film 50 and is, for example, a resin sheet. The conductive plate 30 is bonded to the lower surface of the ceramic plate 20 with the bonding sheet 60 and the dense insulating film 50 interposed therebetween. The bonding sheet 60 has through holes having a diameter same as or slightly larger than the opening diameter of the pores 26 at positions directly below the pores 26. The gas outlet portion 44 is in communication with the pore 26 via the space inside the through hole, and this space is referred to as a pore side space 27. The portion of the upper surface of the protrusion 42 of the insulating gas passage plug 40 that is exposed to the pore side space 27 is the gas outlet portion 44. The portion of the upper surface of the protrusion 42 other than the gas outlet portion 44 is bonded to the lower surface of the bonding sheet 60.

Next, a usage example of the wafer placement table 10 having the above-described configuration will be described. First, a wafer W is placed on the wafer placement surface 21 of the wafer placement table 10 mounted in a chamber (not illustrated). Then, the chamber is depressurized by a vacuum pump to a predetermined vacuum degree, and a DC voltage is applied across the electrode 22 of the ceramic plate 20 to generate an electrostatic attraction force. This allows the wafer W to be attracted and held by the wafer placement surface 21. Next, a reaction gas atmosphere having a predetermined pressure (e.g., tens to hundreds of Pa) is created in the chamber. In this state, RF voltage is applied between an upper electrode (not illustrated) on the ceiling of the chamber and the conductive plate 30 of the wafer placement table 10 to generate plasma. The surface of the wafer W is treated by the generated plasma. A refrigerant is circulated in the refrigerant flow path of the conductive plate 30. Backside gas is introduced from a gas cylinder (not illustrated) to the gas supply passage 31. The backside gas may be heat transfer gas (e.g., He gas). Backside gas introduced into the gas supply passage 31 flows through, in this order, the gap S in the plug chamber 32, the insulating gas passage plug 40, the pore side space 27, and the pore 26, to the backside of wafer W. The presence of the backside gas increases efficiency of heat conduction between the wafer W and the ceramic plate 20.

Figure 4A:
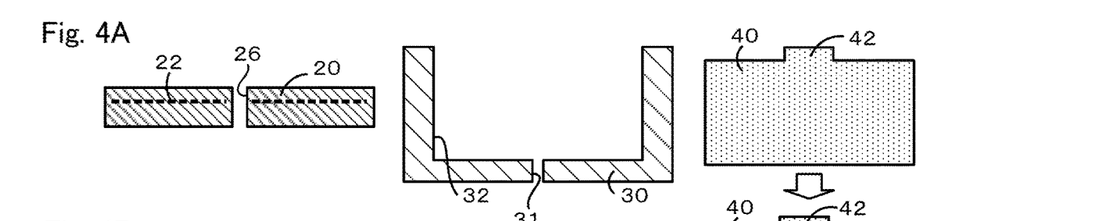
FIGS. 4A to 4F illustrate processes of producing the wafer placement table 10.
Figure 4B:
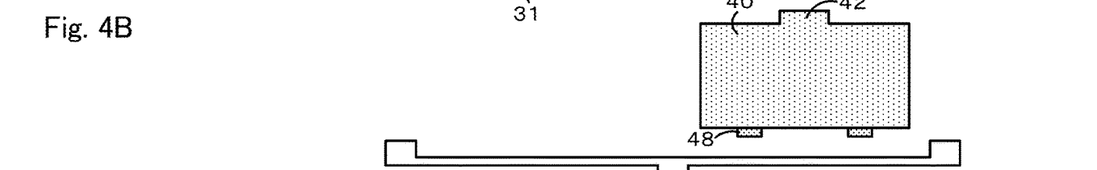

Next, an example of a process of producing the wafer placement table 10 will be described with reference to FIGS. 4A to 4F. FIGS. 4A to 4F illustrate processes of producing the wafer placement table 10. First, the ceramic plate 20 and the conductive plate 30 to be bonded to each other and the insulating gas passage plug 40 to be placed in the plug chamber 32 are provided (FIG. 4A). For example, a molded body of ceramic powder including a built-in electrode 22 is produced, and then the molded body is subjected to hot-press firing to produce the ceramic plate 20. Furthermore, the pores 26 are formed in advance in the ceramic plate 20, and the gas supply passages 31, the plug chambers 32, and the refrigerant flow paths are formed in advance in the conductive plate 30. The plug chambers 32 may be formed when the conductive plate 30 is formed, or the plug chambers 32 may be formed after the conductive plate 30 is produced. In production of the conductive plate 30, multiple MMC disc members may be produced first, then grooves and holes may be formed in these MMC disc members by machining, and then the MMC disc members may be bonded using a metal bonding material so that the grooves and holes eventually become the gas supply passages 31, the plug chambers 32, and the refrigerant flow paths.

Figure 4C:
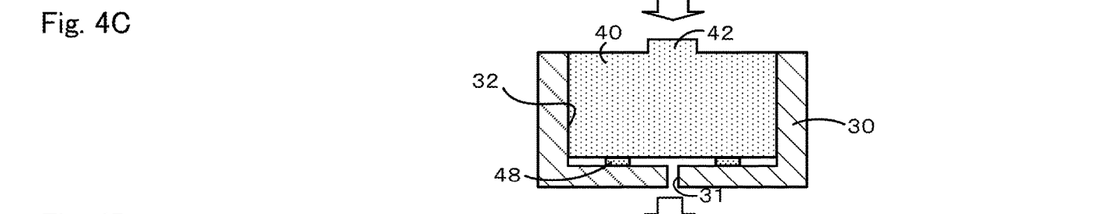
Figure 4D:
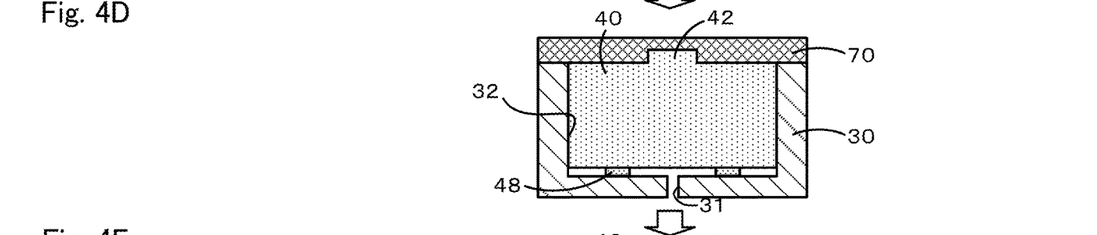
Figure 4E:
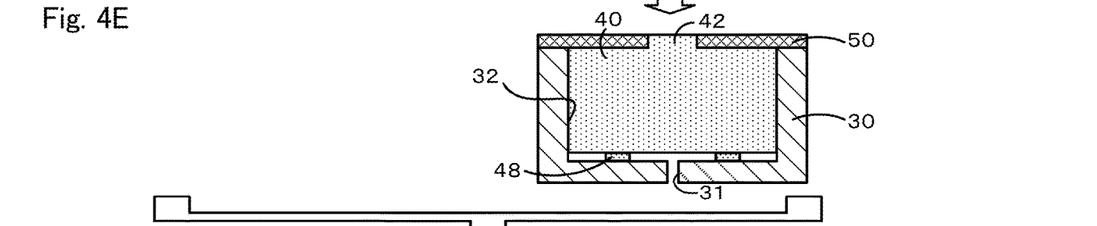
Figure 4F:
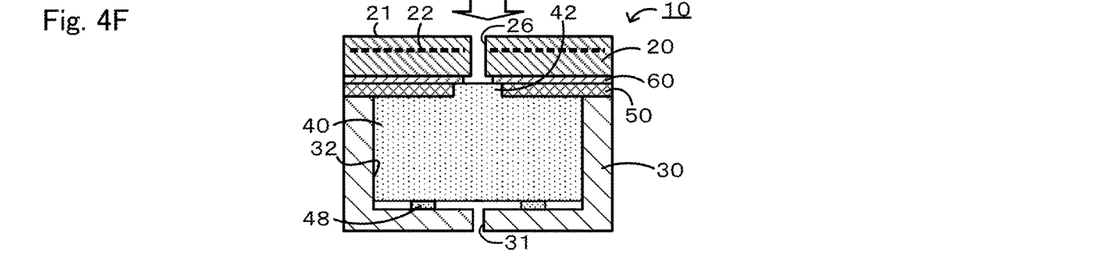

Next, the elastic member 48 is fixed to the lower surface of the insulating gas passage plug 40 (FIG. 4B), and then the insulating gas passage plug 40 is attached to the conductive plate 30 (FIG. 4C). The attachment of the insulating gas passage plug 40 may include applying an adhesive to at least one of the inner peripheral surface of the plug chamber 32 or the outer peripheral surface of the insulating gas passage plug 40 and then inserting the insulating gas passage plug 40 into the plug chamber 32 from above to attach and fix the outer peripheral surface of the insulating gas passage plug 40 and the inner peripheral surface of the plug chamber 32 to each other. Then, a dense insulating film 70 is formed on the upper surfaces of the conductive plate 30 and the insulating gas passage plug 40 by thermal spraying or AD method using the material of the dense insulating film 50 (FIG. 4D). The dense insulating film 70 is thicker than the dense insulating film 50 and is formed over the entire upper surface of the conductive plate 30 and the insulating gas passage plug 40 including the upper surface of the protrusion 42. The upper surface of the dense insulating film 70 is then ground to reduce the thickness of the dense insulating film 70 until the upper surface of the protrusion 42 is exposed (FIG. 4E). Thus, the dense insulating film 70 becomes the dense insulating film 50. Then, the ceramic plate 20 and the insulating gas passage plug 40 having the attached conductive plate 30 and the dense insulating film 50 are then bonded to each other with the bonding sheet 60 interposed therebetween to produce the wafer placement table 10 (FIG. 4F).

In this embodiment of the wafer placement table 10 described in detail above, the dense insulating film 50 is disposed across the upper surface of the conductive plate 30 and the upper surface of the body 41 of the insulating gas passage plug 40 to cover the boundary between the upper surface of the conductive plate 30 and the upper surface of the insulating gas passage plug 40. The presence of such a dense insulating film 50 can reduce the occurrence of electrical discharges in the vertical path extending from the boundary between the upper surface of the conductive plate 30 and the upper surface of the insulating gas passage plug 40 along the side surface of the insulating gas passage plug 40. Furthermore, the dense insulating film 50 allows ventilation at the gas outlet portion 44 of the insulating gas passage plug 40. The presence of the dense insulating film 50 does not prevent gas from flowing from the gas supply passage 31 to the pore 26 through the insulating gas passage plug 40.

Figure 5:
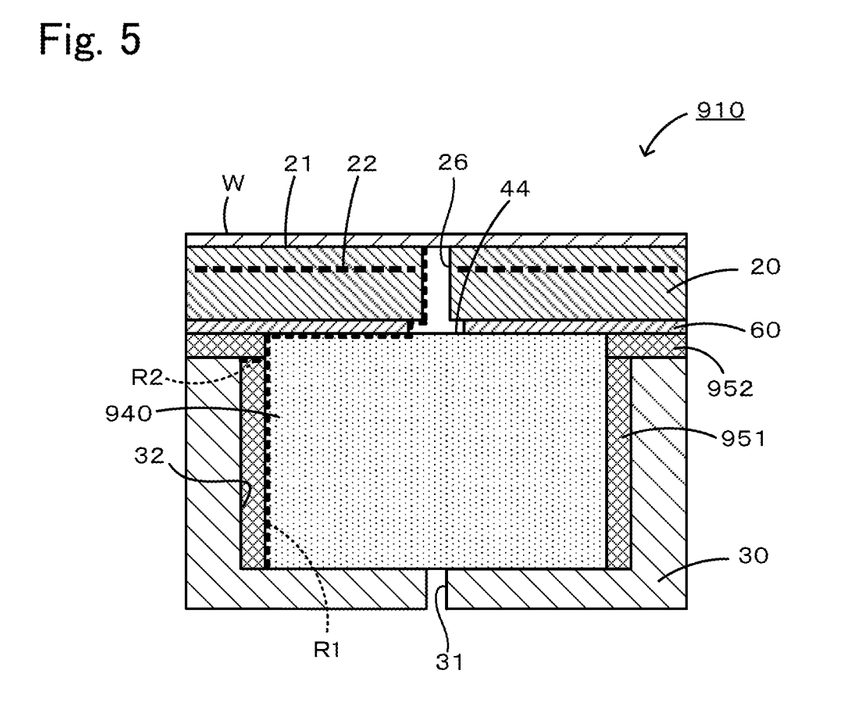
FIG. 5 is a magnified view of a wafer placement table 910 according to a comparative embodiment and corresponds to FIG. 2.

Here, for comparison with the above-described embodiment, a wafer placement table 910 without the dense insulating film 50 (referred to as a comparative embodiment) will be described with reference to FIG. 5. FIG. 5 is a magnified view of the wafer placement table 910 of the comparative embodiment and corresponds to FIG. 2. The same reference numerals are used to describe the same components as those in the wafer placement table 10. The wafer placement table 910 has a cylindrical insulating gas passage plug 940 not having the protrusion 42, instead of the insulating gas passage plug 40, in the plug chamber 32. Furthermore, the wafer placement table 910 includes, instead of the dense insulating film 50, a dense insulating film 951 on the outer peripheral surface of the insulating gas passage plug 940 and a dense insulating film 952 covering the upper surface of the conductive plate 30. In the wafer placement table 910, the side surface (outer peripheral surface) of the insulating gas passage plug 940 is in contact with the dense insulating film 951 and the dense insulating film 952. The contact surface between the insulating gas passage plug 940 and the dense insulating films 951 and 952 extends in the vertical direction. The voltage applied to the wafer placement table 910 during use creates a potential difference in the vertical direction, so electrical discharges are likely to occur in the area between the insulating gas passage plug 940 and the dense insulating films 951 and 952, i.e., near the side surface of the insulating gas passage plug 940. Thus, electrical discharges may occur along the discharge path R1 (see, the dotted line) extending along the side surface of the insulating gas passage plug 940 to the wafer W via the upper surface of the insulating gas passage plug 940 and the inner peripheral surface of the pore 26. Furthermore, production of the wafer placement table 910 requires separate formation of the dense insulating film 951 on the side surface of the insulating gas passage plug 940 and the dense insulating film 952 on the upper surface of the conductive plate 30. Thus, electrical discharges are also likely to occur at the interface between the dense insulating film 951 and the dense insulating film 952. Thus, electrical discharges may occur along the discharge path R2 (see, the dotted line) extending from the interface between the dense insulating film 951 and the dense insulating film 952 to the wafer W via the side surface and the upper surface of the insulating gas passage plug 940 and the inner peripheral surface of the pore 26. In contrast, in the wafer placement table 10 according to the present embodiment, the dense insulating film 50 is placed on the upper surface of the insulating gas passage plug 40, not on the side surface, and the contact surface between the dense insulating film 50 and the insulating gas passage plug 40 extends in the horizontal direction, and thus the discharge path is unlikely to run between the dense insulating film 50 and the insulating gas passage plug 40. Furthermore, the dense insulating film 50 is disposed across the upper surface of the conductive plate 30 and the upper surface of the insulating gas passage plug 40, and thus the dense insulating film 50 does not have an interface between a portion covering the upper surface of the conductive plate 30 and a portion covering the upper surface of the insulating gas passage plug 40. Thus, the boundary between the conductive plate 30 and the insulating gas passage plug 40 is unlikely to become a discharge path. As described above, in the wafer placement table 10, the presence of the dense insulating film 50 reduces the occurrence of electrical discharges in the vertical path extending from the boundary between the upper surface of the conductive plate 30 and the upper surface of the insulating gas passage plug 40 along the side surface of the insulating gas passage plug 40.

Furthermore, in the wafer placement table 910, the upper surface of the insulating gas passage plug 140 is in direct contact with the bonding sheet 60. If the insulating gas passage plug 140 is a porous member, the upper surface of the insulating gas passage plug 140 has bumps and dips due to open pores. This may reduce the adhesion between the insulating gas passage plug 140 and the bonding sheet 60. In contrast, in the wafer placement table 10, the dense insulating film 50 is present between the insulating gas passage plug 40 and the bonding sheet 60. This is likely to increase the adhesion between the insulating gas passage plug 40, the dense insulating film 50, and the bonding sheet 60. For example, if the insulating gas passage plug 40 is a porous member, and the dense insulating film 50 is formed on the upper surface of the insulating gas passage plug 40 by thermal deposition or AD method, the constituent particles of the dense insulating film 50 fit in the bumps and dips on the upper surface of the insulating gas passage plug 40. This increases the adhesion between the insulating gas passage plug 40 and the dense insulating film 50. Furthermore, since the dense insulating film 50 is dense, the adhesion between the dense insulating film 50 and the bonding sheet 60 is higher than the adhesion between the porous insulating gas passage plug 940 and the bonding sheet 60.

Furthermore, the insulating gas passage plug 40 has the protrusion 42, which has the upper surface serving as the gas outlet portion 44, on the upper surface of the body 41. The upper surface of the dense insulating film 50 and the upper surface of the protrusion 42 are flush with each other. As explained using FIGS. 4D and 4E, the dense insulating film 70 is formed to cover the entire upper surface of the conductive plate 30 and the entire upper surface of the insulating gas passage plug 40, and then the dense insulating film 70 is ground until the upper surface of the protrusion 42 is exposed. Thus, the dense insulating film 50 that allows ventilation at the gas outlet portion 44 can be relatively readily formed. Furthermore, since the upper surface of the dense insulating film 50 and the upper surface of the protrusion 42 are flush with each other, a gap other than a gas flow path is unlikely to be formed when the conductive plate 30 on which the dense insulating film 50 has been formed and the ceramic plate 20 are bonded to each other. This can further reduce electrical discharges.

Furthermore, since the dense insulating film 50 is a thermal sprayed film or an aerosol deposition film, the dense insulating film 50 can be relatively readily formed.

The wafer placement table 10 further includes the elastic member 48 located between the lower surface of the insulating gas passage plug 40 and the bottom surface of the plug chamber 32. The presence of the elastic member 48 can reduce the possibility that the insulating gas passage plug 40 will be pushed up, when the conductive plate 30 is heated and warped into a convex shape during use of the wafer placement table 10, for example. When the insulating gas passage plug 40 is pushed up, cracks may occur in the portion of the dense insulating film 50 that covers the boundary between the conductive plate 30 and the insulating gas passage plug 40. However, the elastic member 48 acts as a cushioning material and reduces the possibility that the insulating gas passage plug 40 will be pushed up, reducing cracks in the dense insulating film 50.

Since the elastic member 48 is formed of a heat-resistant resin, the elastic member can be relatively readily formed.

The present invention should not be limited to the above-described embodiment and may be implemented in various modes without departing from the technical scope of the present invention.

Figure 6:
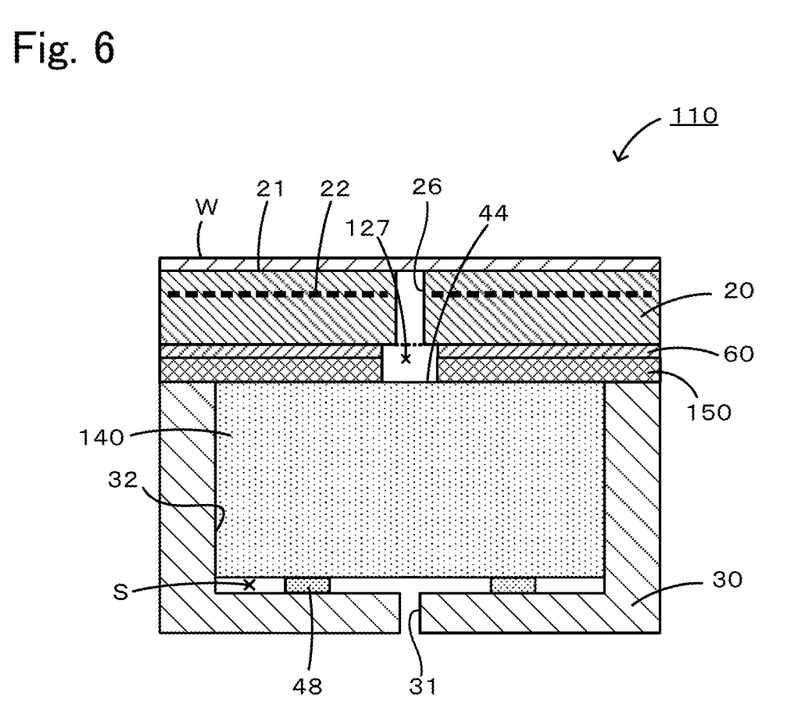
FIG. 6 is a magnified view of a wafer placement table 110 and corresponds to FIG. 2.

For example, in the above-described embodiment, the insulating gas passage plug 40 has the protrusion 42 but should not be limited to this. FIG. 6 is a magnified view illustrating a wafer placement table 110, which is another example of the wafer placement table 10, and corresponds to FIG. 2. In FIG. 6, the same reference numerals are used to describe the same components as those in the wafer placement table 10 without explanations. The wafer placement table 110 includes, instead of the insulating gas passage plug 40, a cylindrical insulating gas passage plug 140 not having the protrusion 42. The dense insulating film 150 has an opening directly above the gas outlet portion 44 and does not cover the gas outlet portion 44 to allow ventilation at the gas outlet portion 44, which is a portion of the upper surface of the insulating gas passage plug 140. The dense insulating film 150 covers the entire upper surface of the insulating gas passage plug 140 except for the above-described portion. The dense insulating film 150 is disposed across the upper surface of the conductive plate 30 and the upper surface of the insulating gas passage plug 140 to cover the boundary between the upper surface of the conductive plate 30 and the upper surface of the insulating gas passage plug 140. In the wafer placement table 110, as in the above-described embodiment, the presence of the dense insulating film 150 can reduce the occurrence of electrical discharges in the vertical path extending from the boundary between the upper surface of the conductive plate 30 and the upper surface of the insulating gas passage plug 140 along the side surface of the insulating gas passage plug 140. However, the insulating gas passage plug 140 not having the protrusion 42 requires formation of an opening in the formation of the dense insulating film 150 such that the dense insulating film 150 does not cover the gas outlet portion 44. For example, a portion of the upper surface of the insulating gas passage plug 140 has to be masked during formation of the dense insulating film 150 or a hole has to be formed in the dense insulating film 150 after formation of the dense insulating film 150 such that the gas outlet portion 44 is exposed. Thus, the dense insulating film 50, which can be more readily formed than the dense insulating film 150, is preferred. Furthermore, instead of the protrusions 42, the wafer placement table 110 has openings in the dense insulating film 150 that do not cover the gas outlet portions 44. Thus, the pore side space 127 is larger in FIG. 6 by the thickness of the dense insulating film 150 than the pore side space 27 in FIG. 2. Thus, in view of reduction of electrical discharges in the space, an insulating gas passage plug 40 having the protrusion 42 as illustrated in FIG. 2 is preferred. In the wafer placement table 10 in FIG. 2, the protrusion 42 exists, and the dense insulating film 50 covers the entire side surface of the protrusion 42. Thus, the pore side space 27 is defined only by the through hole of the bonding sheet 60, and the pore side space 27 is small.

In the above-described embodiment, the presence of the elastic member 48 provides the gap S between the lower surface of the insulating gas passage plug 40 and the bottom surface of the plug chamber 32 of the conductive plate 30, but the present invention should not be limited to this. For example, the elastic member 48 may be in contact with the entire lower surface of the insulating gas passage plug 40 except for the portion directly above the gas supply passage 31. There may be no gap between the lower surface of the insulating gas passage plug 40 and the bottom surface of the plug chamber 32 other than a gas flow path. In this case, the presence of the elastic member 48 can also reduce the possibility that the insulating gas passage plug 40 will be pushed up. Furthermore, the shape of the elastic member 48 is not limited to a ring shape but may also be rod-shaped or the like. The elastic member 48 may have an easily deformable shape, such as a shape having a hollow portion and a wavy shape. The wafer placement table 10 does not have to include the elastic member 48. In this case, the lower surface of the insulating gas passage plug 40 and the bottom surface of the plug chamber 32 may be in contact with each other. Multiple elastic members 48 may be disposed on the lower surface of one insulating gas passage plug 40.

In the above-described embodiment, a gap may exist between the outer peripheral surface of the insulating gas passage plug 40 and the inner peripheral surface of the plug chamber 32. The presence of the dense insulating film 50 reduces electrical discharges even if a gap exists between the outer peripheral surface of the insulating gas passage plug 40 and the inner peripheral surface of the plug chamber 32.

In the above-described embodiment, the insulating gas passage plug 40 is a porous member but does not have to be a porous member and may be any member though which gas can pass. For example, the insulating gas passage plug 40 may be formed of finely crushed insulating ceramics solidified with an inorganic adhesive to be breathable, or it may be formed of fiberglass or heat-resistant Teflon resin sponge (Teflon is a registered trademark). Alternatively, the insulating gas passage plug 40 may be a dense plug having an internal gas flow path. The gas internal flow path may be a straight through hole extending in the vertical direction or a passage winding and extending through the dense plug between the upper surface and the lower surface. A passage winding and extending through the dense plug between the upper surface and the lower surface may be a spiral passage or a zigzag passage. The gas internal flow path has a diameter in cross section of, preferably, greater than or equal to 0.1 mm and less than or equal to 1 mm. One dense plug may have multiple gas internal flow paths. The porosity of the dense portion of the dense plug is preferably, for example, less than 0.1%. The dense plug may be formed of ceramic such as alumina and aluminum nitride, for example, as the above-described insulating gas passage plug 40, which is the porous member. To form the dense plug, a molded body formed using a 3D printer may be fired or a molded body formed by cast molding may be fired. Details of the dense plug having the gas internal flow path winding and extending through the dense plug and the mold-cast molding are disclosed in, for example, Japanese Patent No. 7149914.

In the above-described embodiment, the gas supply passage 31 is a through hole extending vertically through the conductive plate 30 but should not be limited to this. The gas supply passage 31 is not limited to one extending in the vertical direction and may wind in the middle. The gas supply passage 31 may have one or more first gas passages, which open on the lower surface of the conductive plate 30 and is fewer in number than the plug chambers, and multiple second gas passages, which branch off from the first gas passages and correspond one-to-one to the plug chambers 32.

In the above-described embodiment, the ceramic plate 20 and the conductive plate 30 are bonded to each other with the insulating bonding sheet 60. However, a conductive bonding layer such as a metal bonding layer may be used instead of the bonding sheet 60.

In the above-described embodiment, the ceramic plate 20 includes a built-in electrostatic electrode as the electrode 22. However, a built-in heater electrode (a resistance heating element) may be included instead of or in addition to the built-in electrostatic electrode. In such a case, a heater power supply is connected to the heater electrode. The ceramic plate 20 may include one layer of built-in electrodes or two or more spaced-apart layers of built-in electrodes.

In the above-described embodiment, the wafer placement table 10 may have a lift pin hole extending through the wafer placement table 10. The lift pin hole receives a lift pin that moves the wafer W up and down with respect to the wafer placement surface 21. When the wafer W is supported by three lift pins, for example, the lift pin holes are provided at three locations.

International Application No. PCT/JP2023/004362, filed on Feb. 9, 2023, is incorporated herein by reference in its entirety.

What is claimed is:

1. A wafer placement table comprising:
a ceramic plate having an upper surface serving as a wafer placement surface, a pore extending vertically through the ceramic plate, and a built-in electrode;
a conductive plate bonded to a lower surface of the ceramic plate and having a gas supply passage;
a plug chamber that is a recess extending from an upper surface of the conductive plate toward a lower surface of the conductive plate and is in communication with the pore and the gas supply passage;
an insulating gas passage plug located in the plug chamber and through which gas is allowed to pass; and
a dense insulating film allowing ventilation at a gas outlet portion that is a portion of an upper surface of the insulating gas passage plug and serves as a gas flow path to the pore, the dense insulating film being disposed across the upper surface of the conductive plate and the upper surface of the insulating gas passage plug to cover a boundary between the upper surface of the conductive plate and the upper surface of the insulating gas passage plug;
wherein the upper surface of the insulating gas passage plug has a protrusion having an upper surface serving as the gas outlet portion, and the upper surface of the dense insulating film and the upper surface of the protrusion are flush with each other.

2. The wafer placement table according to claim 1, wherein the dense insulating film is a thermal sprayed film or an aerosol deposition film.

3. The wafer placement table according to claim 1, further comprising an elastic member between a lower surface of the insulating gas passage plug and a bottom surface of the plug chamber.

4. The wafer placement table according to claim 3, wherein the elastic member is a heat-resistant resin.

5. The wafer placement table according to claim 1, wherein the insulating gas passage plug is a porous member.

6. The wafer placement table according to claim 2, further comprising an elastic member between a lower surface of the insulating gas passage plug and a bottom surface of the plug chamber.

7. The wafer placement table according to claim 6, wherein the elastic member is a heat-resistant resin.

* * * * *